(12) United States Patent
Yudovsky et al.

(10) Patent No.: US 6,375,748 B1
(45) Date of Patent: Apr. 23, 2002

(54) METHOD AND APPARATUS FOR PREVENTING EDGE DEPOSITION

(75) Inventors: Joseph Yudovsky, Campbell; Tom Madar, Sunnyvale; Salvador Umotoy, Antioch; Son Ngoc Trinh, Cupertino; Lawrence C. Lei, Milpitas; Anzhong (Andrew) Chang, San Jose; Xiaoxiong (John) Yuan, Cupertino, all of CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/387,928

(22) Filed: Sep. 1, 1999

(51) Int. Cl.⁷ ............................................. C23C 16/00
(52) U.S. Cl. ..................... 118/728; 118/715; 156/345
(58) Field of Search ............................ 118/728, 715; 156/345

(56) References Cited

U.S. PATENT DOCUMENTS

| | | | |
|---|---|---|---|
| 4,911,812 A | | 3/1990 | Kudo et al. |
| 5,326,725 A | * | 7/1994 | Sherstinsky et al. ........ 438/778 |
| 5,556,476 A | * | 9/1996 | Lei et al. ................... 118/728 |
| 5,558,717 A | * | 9/1996 | Zhao et al. ................. 118/715 |
| 5,697,427 A | * | 12/1997 | Ngan et al. ................ 165/80.1 |
| 5,766,365 A | * | 6/1998 | Umotoy et al. ............ 118/728 |
| 5,846,332 A | * | 12/1998 | Zhao et al. ................. 118/728 |
| 5,851,299 A | * | 12/1998 | Cheng et al. ............... 118/729 |
| 5,863,340 A | * | 1/1999 | Flanigan .................... 118/728 |
| 5,888,304 A | * | 3/1999 | Umotoy et al. ............ 118/720 |

FOREIGN PATENT DOCUMENTS

EP 0 619 381 A1 12/1994

* cited by examiner

Primary Examiner—Jeffrie R. Lund
Assistant Examiner—Sylviar MacArthur
(74) Attorney, Agent, or Firm—Dugan & Dugan LLP

(57) ABSTRACT

A substrate support having a removable edge ring, which is made of a material having a lower coefficient of thermal expansion (CTE), than that of the substrate support is provided. The edge ring and the substrate support are configured for pin and slot coupling. Specifically, either the edge ring, or the substrate support comprises a plurality of pins, and the other of the edge ring or the substrate support comprises a plurality of hollow regions or slots in which the pins may be inserted. The slots are at least as wide as a corresponding one of the plurality of pins and extend in the direction in which the substrate support expands and contracts during thermal cycling. Each of the slots extends a length which is sufficient to compensate for the difference between the CTE of the substrate support and the CTE of the edge ring, over the range of process temperatures to which the apparatus is exposed. Preferably the susceptor is made of aluminum, and the edge ring is made of ceramic. A restrictor gap may be defined between a surface of the substrate support and a surface of the purge ring so as to restrict a volume of purge gas flowing to an edge of a substrate positioned on the substrate support. The purge gas delivery channel may have an exposed outlet and may be upwardly angled to facilitate cleaning.

24 Claims, 7 Drawing Sheets

METHOD AND APPARATUS FOR PREVENTING EDGE DEPOSITION

FIELD THE INVENTION

The present invention relates to an improved susceptor which more uniformly inhibits the deposition of process gasses on the edge and backside of a substrate, and which may be easily cleaned.

BACKGROUND OF THE INVENTION

Chemical vapor deposition (CVD) is one of a number of processes used to deposit thin films of material on semiconductor substrates. To process substrates using CVD, a vacuum chamber is provided with a susceptor configured to receive a substrate. In a typical CVD chamber, the substrate is placed into and removed from the chamber by a robot blade and is supported by the susceptor during processing. A precursor gas is charged into the vacuum chamber through a gas manifold plate situated above the substrate, where the substrate is heated to process temperatures, generally in the range of about 250° to 650° C. The precursor gas reacts on the heated substrate surface to deposit a thin layer thereon and to form volatile byproduct gases, which are pumped away through the chamber exhaust system.

A primary goal of substrate processing is to obtain the largest useful surface area, and as a result the greatest number of chips, possible from each substrate. This is highlighted by the recent demands from semiconductor chip manufacturers for zero edge exclusion on the substrates processed, i.e., that no portion of the substrate surface, including the edge of the wafer, be wasted. Some important factors to consider include processing variables that effect the uniformity and thickness of the layer deposited on the substrate, and contaminants that can attach to the substrate and render all or a portion of the substrate useless. Both of these factors should be controlled to maximize the useful surface area for each substrate processed.

One cause of particle contamination in the chamber is deposition of material at the edge or on the backside of the substrate. Substrate edges are typically beveled, making deposition difficult to control over these surfaces. Thus deposition at substrate edges can be nonuniform. Additionally where metal is deposited, it tends to adhere differently to dielectrics than it does to silicon. If a wafer's dielectric layer does not extend to the bevel, metal may be deposited on a silicon bevel, and cause flaking. This may lead to deposited layers that do not adhere properly to the substrate edge and eventually chip or flake, generating unwanted particles in the chamber.

Additionally, chemical mechanical polishing is often used to smooth the surface of a substrate coated with tungsten or other metals. The act of polishing causes any deposits on the edge and backside surfaces to flake and generate unwanted particles. A number of approaches have been employed to control the deposition of process gasses on the edge of the substrate during processing. One approach employs a shadow ring which essentially masks a portion of the perimeter of the substrate from the process gasses, reducing the overall useful surface area of the substrate. In light of the current demand for zero edge exclusion, this method is becoming less preferred.

Another approach employs a purge ring near the edge of the substrate for delivering a purge gas along the substrate's edge to thereby prevent edge deposition. The purge gas limits or prevents the deposition gas from reaching the substrate and thus limits or prevents deposition on the wafer's beveled edge. A third approach uses a shutter ring and a purge ring in combination to form a purge gas chamber having a purge gas inlet and outlet adjacent the substrate's edge so as to guide the purge gas across the wafer's edge.

A wafer typically sits just inside (radially) the purge ring, with a gap therebetween. Conventionally purge rings are made of aluminum and are welded to the substrate support in an effort to prevent the ring from deforming during processing. However, during the thermal cycling which occurs within a CVD processing chamber, the aluminum rings nonetheless deform, losing the integrity of their shape and therefore compromise their ability to keep particles from depositing on the substrate's edge. This can change the size of the gap, leading to non-uniformity of deposition across the wafer's edge. As the aluminum rings expand and contract, material thereon can flake, and create particles which can contaminate the wafer.

Further, in order for the rings to work effectively for shadowing and particularly for purging, they must be frequently cleaned to remove deposition material which can alter the gap or flake off and deposit on the wafer. Such cleaning increases chamber downtime, reduces throughput and results in higher operating costs. Accordingly a need exists for an improved susceptor which can reliably prevent edge deposition, and which can be easily cleaned.

SUMMARY OF THE INVENTION

The present invention overcomes the problems of the prior art by providing a substrate support having a removable edge ring, which is made of a material having a lower coefficient of thermal expansion (CTE), than that of the substrate support. The edge ring and the substrate support are configured for pin and slot coupling. Specifically, either the edge ring, or the substrate support include a plurality of pins, and the other of the edge ring or the substrate support include a plurality of hollow regions or slots in which the pins may be inserted. The slots are at least as wide as a corresponding one of the plurality of pins and extend in the direction in which the substrate support expands and contracts during thermal cycling. Each of the slots extends a length which is sufficient to compensate for the difference between the CTE of the substrate support and the CTE of the edge ring, over the range of process temperatures to which the apparatus is exposed. Preferably the susceptor is made of aluminum, and the edge ring is made of ceramic.

The susceptor's performance may be further improved by surrounding each of the plurality of pins with a thermally insulating pad, and by ensuring that each slot has a depth which is greater than the length of a corresponding one of the plurality of pins, such that use of the thermally insulating pads thermally insulates both the pins and the edge ring from the substrate support.

The edge ring may be either of the shadow ring and/or purge ring type. The substrate support may include a purge ring and/or a purge gas channel. Three pins which are radially spaced around a substrate supporting surface, and which interface with three slots which extend radially outwardly with respect to the substrate supporting surface, are presently preferred.

The edge ring of the present invention resist de-formation, due to its relatively low CTE, and due to the pin and slot coupling between the edge ring and substrate support. Further, the pin and slot coupling enables the edge ring to be quickly and easily removed for cleaning, and thus reduces chamber downtime.

Other objects, features and advantages of the present invention will become more fully apparent from the follow-

DETAILED DESCRIPTION THE PREFERRED EMBODIMENTS

Figure 1:
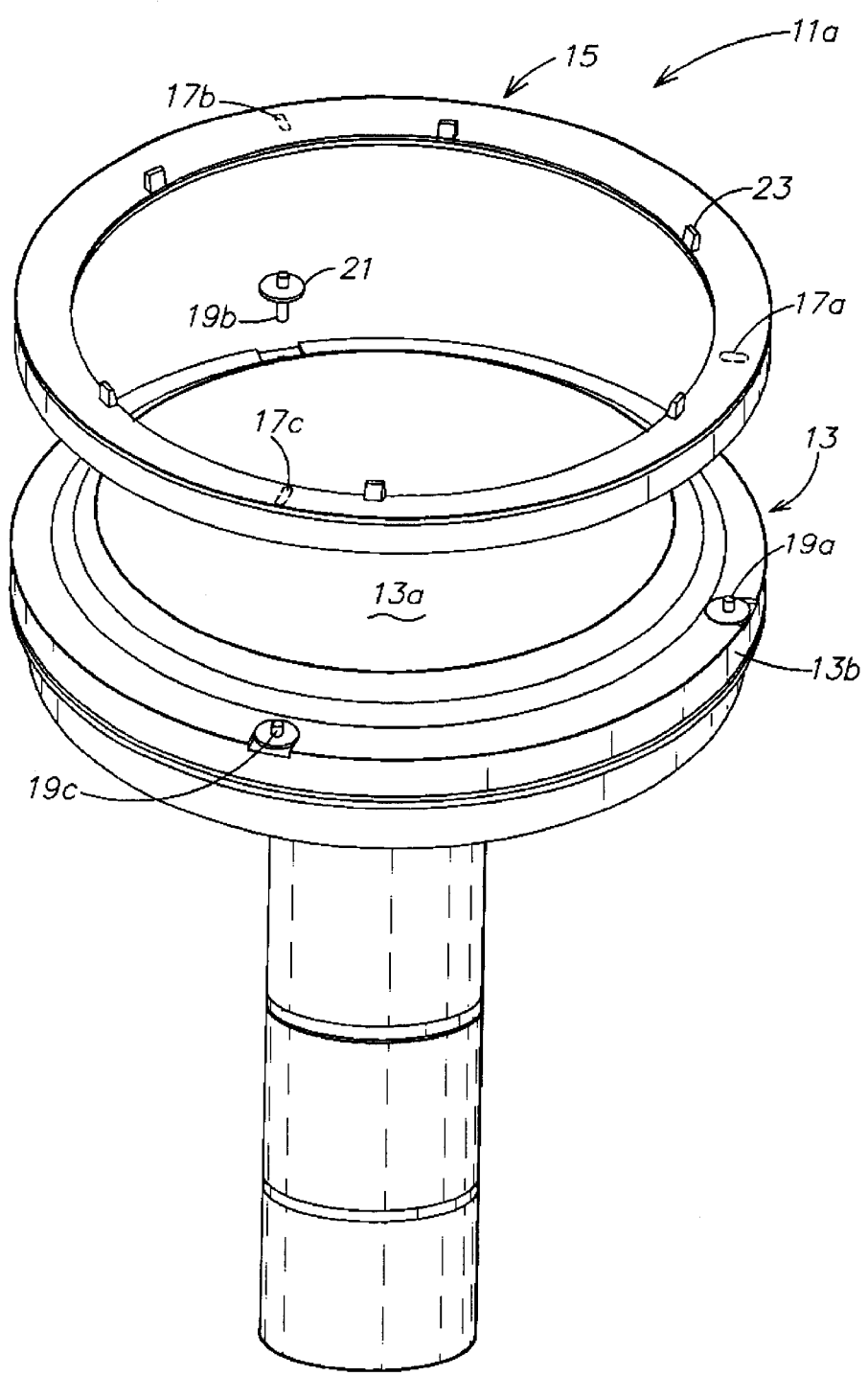
FIG. 1 is an exploded perspective view of a first aspect of an inventive susceptor.

FIG. 1 is an exploded perspective view of a first aspect of an inventive susceptor 11a. The susceptor 11a comprises a substrate support 13, adapted for pin and slot coupling with an edge ring, such as purge ring 15. Specifically, the substrate support 13 comprises three pins 19a–c which extend upwardly from the top surface of substrate support 13. The bottom surface of the purge ring comprises three hollow regions or slots 17 positioned to interface with the three pins 19a–c. The substrate support 13 comprises a central wafer supporting surface 13a, and the three pins 19 are equally spaced radially around the substrate supporting surface 13a. Each of the slots 17 is at least as wide as the corresponding pin 19, and extends radially outward from the center of the substrate supporting surface 13a, in the direction in which the substrate support expands and contracts during thermal cycling.

The substrate support 13 is preferably made of a metal such as aluminum, as is conventional. The purge ring is made of a material having a lower CTE than the CTE of the substrate support material. Preferably the purge ring is made of ceramic. The slots 17 extend a length which is sufficient to compensate for the difference between the CTE of the substrate support material and the CTE of the purge ring material, over the range of process temperatures to which the susceptor 11a is exposed. Preferably each pin 19 is surrounded by a pad 21 made of a thermally insulating material, so as to achieve thermal insulation between the substrate support 13 and the purge ring 15, as further described below with reference to FIG. 2. The pads 21 are preferably made of a highly polished ceramic and therefore allow the purge ring 15 to slide easily therealong while minimizing particle generation. The purge ring 15 may further include a plurality of wafer guide pins 23 to facilitate accurate wafer placement, as is disclosed in U.S. patent application Ser. No. 09/103,462 filed Jun. 24, 1998 (incorporated herein in its entirety by this reference).

Figure 2:
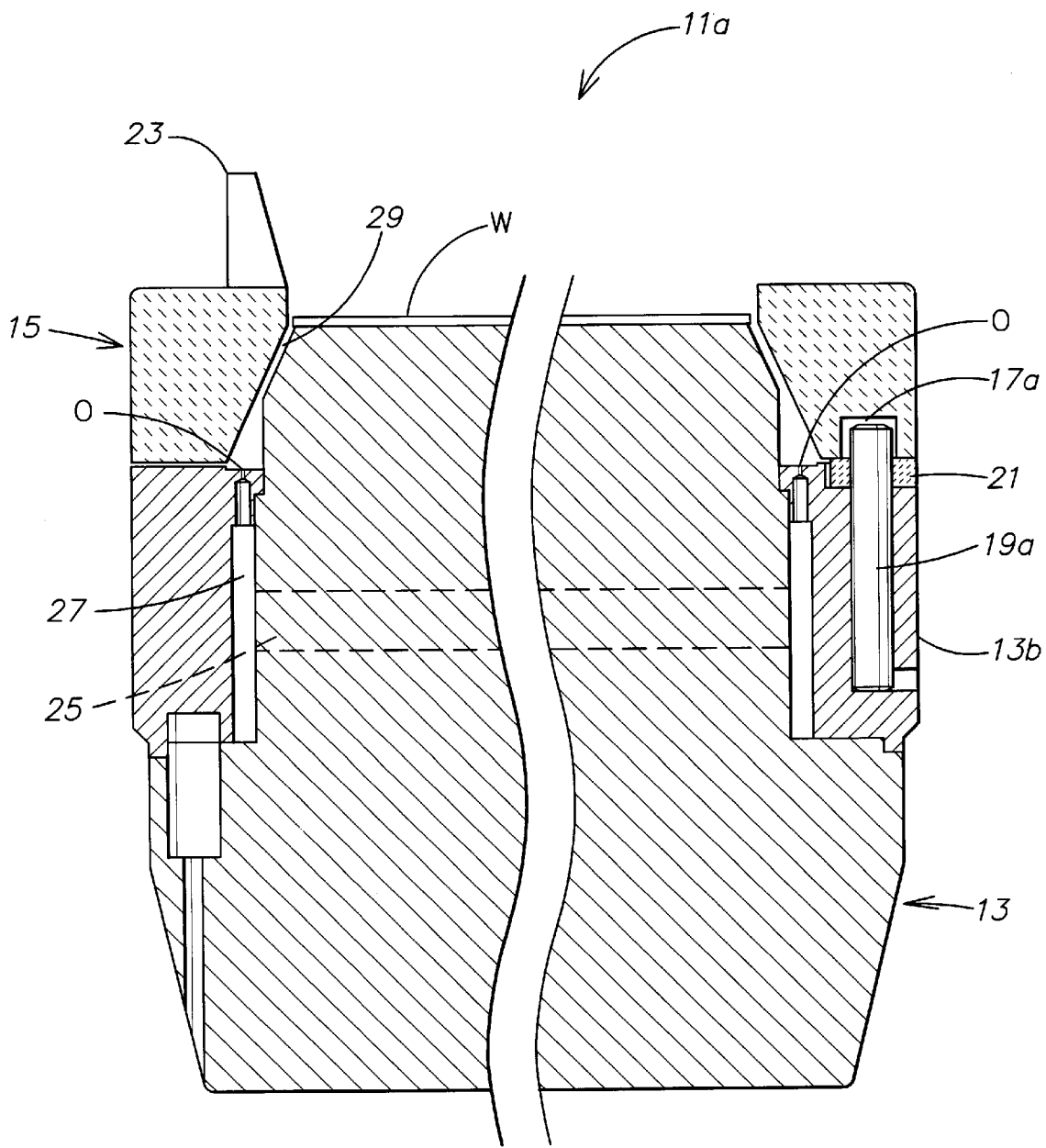
FIG. 2 is a side view, in pertinent part, of the first aspect of the inventive susceptor.

FIG. 2 is a side view, in pertinent part, of the first aspect of the inventive susceptor 11a, having a wafer W positioned thereon. As shown in FIG. 2 the substrate support 13, the purge ring 15 and the slots 17 are configured such that with use of the pad 21, no direct contact exists between the substrate support 13 and the purge ring 15. By thermally insulating the purge ring 15 from the metal substrate support 13, the purge ring 15 experiences less thermal stress then would otherwise result if the purge ring 15 were to directly contact the typically higher temperature substrate support 13. Also as shown in FIG. 2, the slot 17 has a depth greater than the length of the pin 19 to reduce thermal conduction from the substrate support 13 to the purge ring 15, via the pin 19.

The slots 17 extend radially outward relative to the center of the substrate supporting surface 13 and preferably are each just slightly wider than the respective pin 19, thus preventing the purge ring 15 from moving laterally as a result of thermal cycling induced expansion and contraction more than the distance required for clearance between the slot 17 and the pin 19 pair. In this manner the pins also provide rotational alignment.

The substrate support 13 comprises a purge gas delivery channel 25 and a diffuser ring 13b which couples purge gas from the purge gas delivery channel 25 through a purge gas distribution channel 27 defined by an inner edge of the diffuser ring 13b and an outer edge of the substrate support 13, and then through a plurality of small orifices O formed in the diffuser ring 13b to a lower edge of the purge ring 15.

In operation the wafer W is positioned on the wafer supporting surface 13a such that the edge of the wafer W is positioned adjacent the outlet of the purge slot 29. In this manner as purge gas flows upwardly through the purge slot 29 along the edge of the wafer W, deposition on the wafer's edge is prevented. To enable deposition, the susceptor is heated to a temperature in the range of 350° to 475° C., typically by a heating coil embedded in or contacted with the underside of, the susceptor. However, for chamber maintenance or cleaning, the susceptor is typically allowed to cool back to ambient temperatures.

This temperature change causes thermal expansion and contraction of the chamber elements, including the substrate support and the purge ring. Despite thermal cycling which occurs during CVD processing, and the resulting expansion and contraction of the substrate support 13 and the diffuser ring 13b, thermally induced stresses are not imposed upon the purge ring, as it (and the pins supporting it) can move radially as the temperature changes, due to the pin and slot coupling. Any thermally induced expansion of the gap between the purge ring and the wafer is insignificant. Accordingly edge deposition is more uniformly and reliably prevented. Moreover, the purge ring 15 may be easily lifted off the pins 19 for routine cleaning or replacement. Accordingly downtime is minimized.

Figure 3:
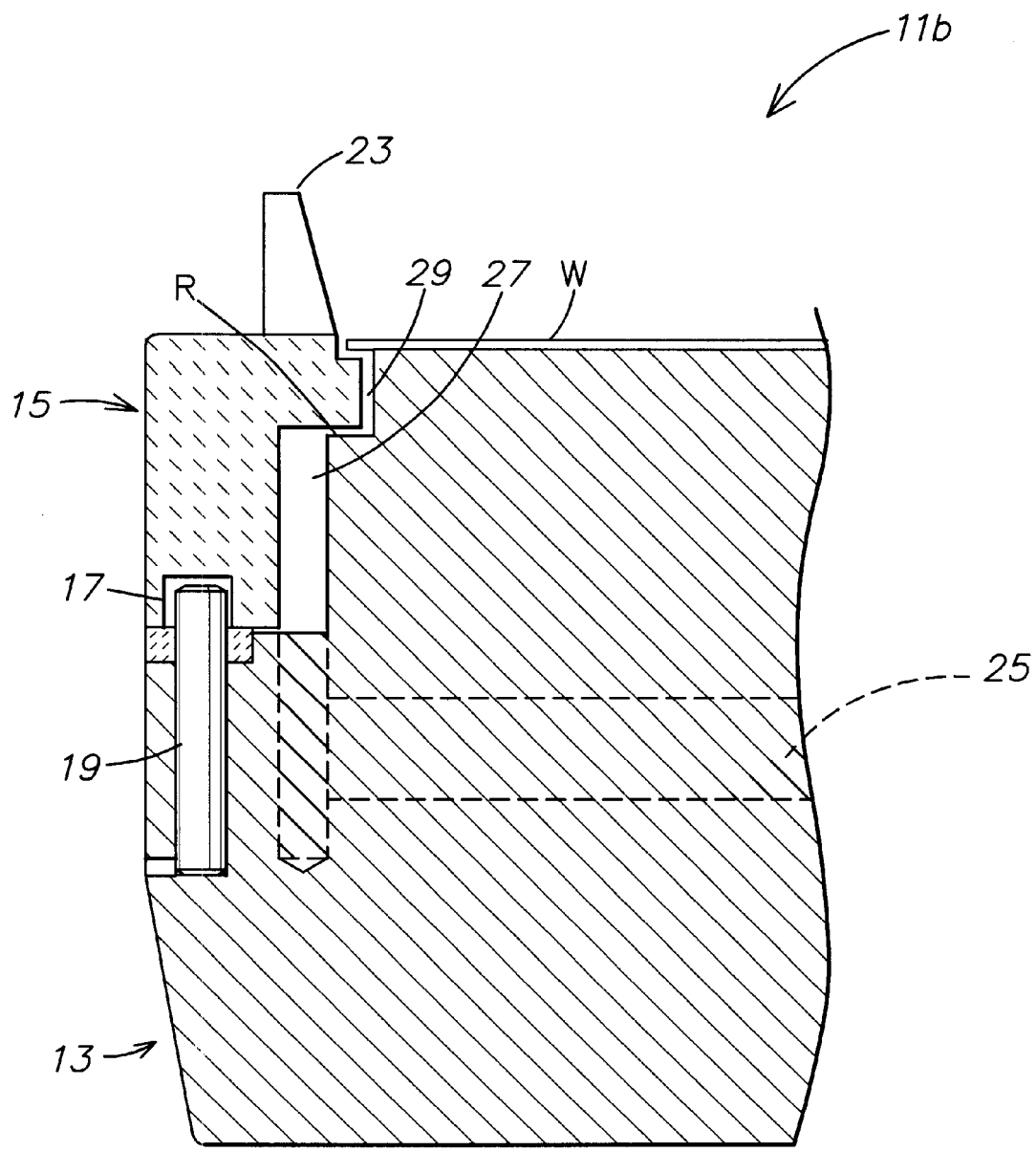
FIG. 3 is a side view, in pertinent part, of a second aspect of the inventive susceptor.

FIG. 3 is a side view, in pertinent part, of a second aspect of the inventive susceptor. The inventive susceptor 11b of FIG. 3 is similar to the susceptor 11a of FIG. 2, except the substrate support 13 of FIG. 2 does not comprise the diffuser ring 13b. Instead the purge gas delivery channel 25 delivers purge gas to a purge gas distribution channel 27 which is defined by an inner edge of the purge ring 15 and an outer edge of the substrate support 13, as is the more narrowly defined purge gas slot 29. The embodiment of FIG. 3 requires fewer parts, and, replaces the orifices O (of FIG. 1) with a restrictor gap R. The restrictor gap R is formed by a horizontal notch in the substrate support 13 and a corresponding horizontal protrusion in the purge ring 15. The size of the restrictor gap R is determined by the respective vertical dimensions of the substrate support 13 and the purge ring 15 to the horizontal notch or protrusion, and by the thickness of the pad 21. The embodiment of FIG. 3 therefore reduces the clogging which may be experienced by the orifices O of the FIG. 1 embodiment as the restrictor gap R which expands radially around the substrate support in a continuum is less likely to clog than are the plurality of orifices O. By reducing the number of parts, the FIG. 3 embodiment also reduces the probability of differential expansion therebetween and the resultant particle generation. Note that, like the FIGS. 1 and 2 embodiment, the purge ring 15 rests on the insulator pads 21 and is aligned by the pins 19.

Figure 4:
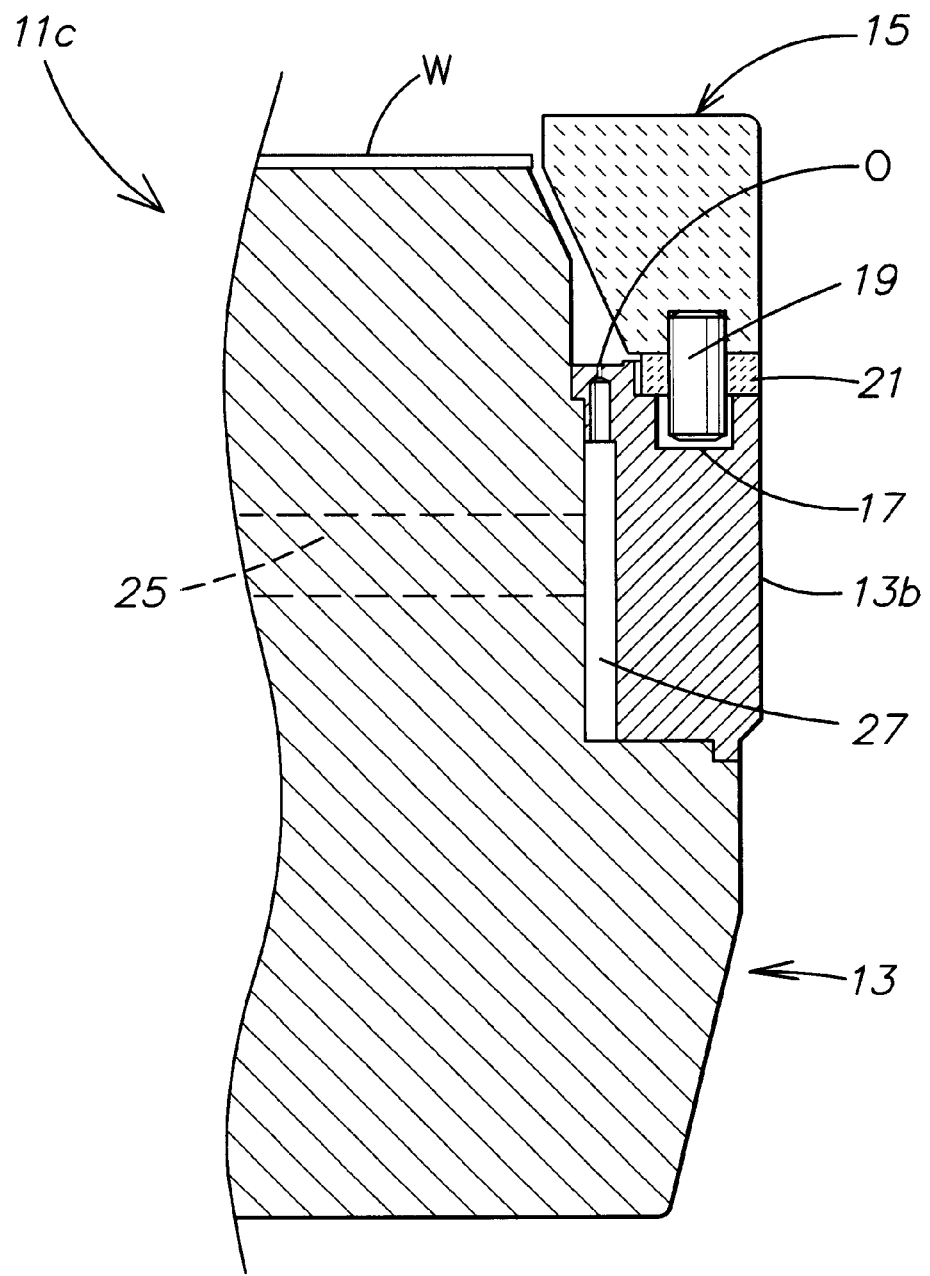
FIG. 4 is a side view in pertinent part of a third aspect of the inventive susceptor.

FIG. 4 is a side view, in pertinent part, of a third aspect of the inventive susceptor. As shown in FIG. 4, the purge ring 15 of the inventive susceptor 11c has a plurality of pins 19 (only one shown) which extend downward from the bottom surface of the purge ring 15. The pins 19 are pressed into the purge ring 15 and the pads 21 are secured to the pins 19 in the same manner, or maybe integral to the pins 19. In operation, the pins 19 are inserted within a corresponding slot 17 located on the substrate support 13. In this example the slots 17 are formed in the diffuser ring portion 13b of the substrate support 13. Thus, FIG. 4 shows that the positions of the pins 19 and the slots 17 may be switched, and still achieve the advantages of pin and slot coupling.

Figure 5A:
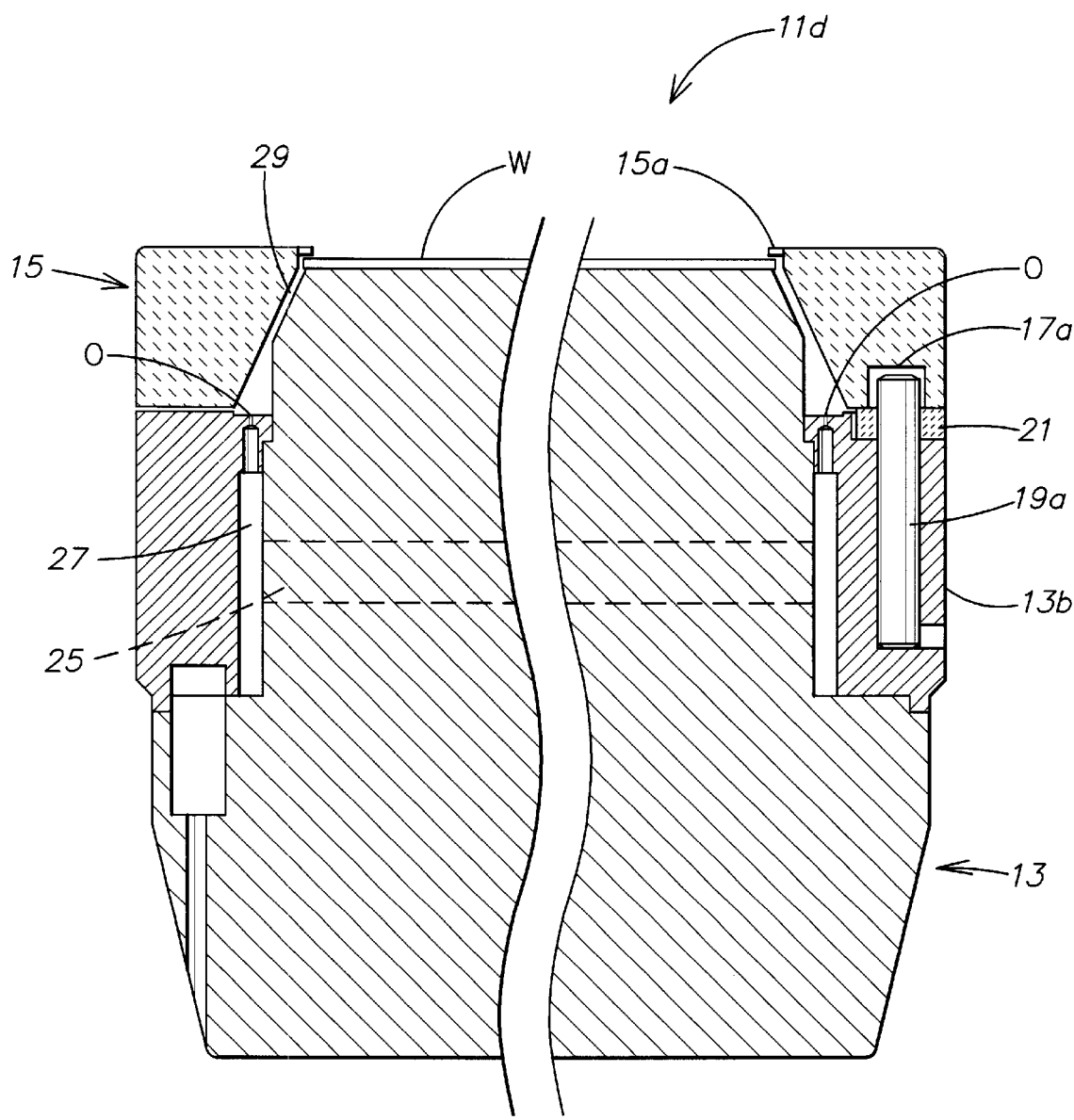
FIGS. 5A and 5B are side views of a fourth aspect, in pertinent part, of the inventive susceptor.
Figure 5B:
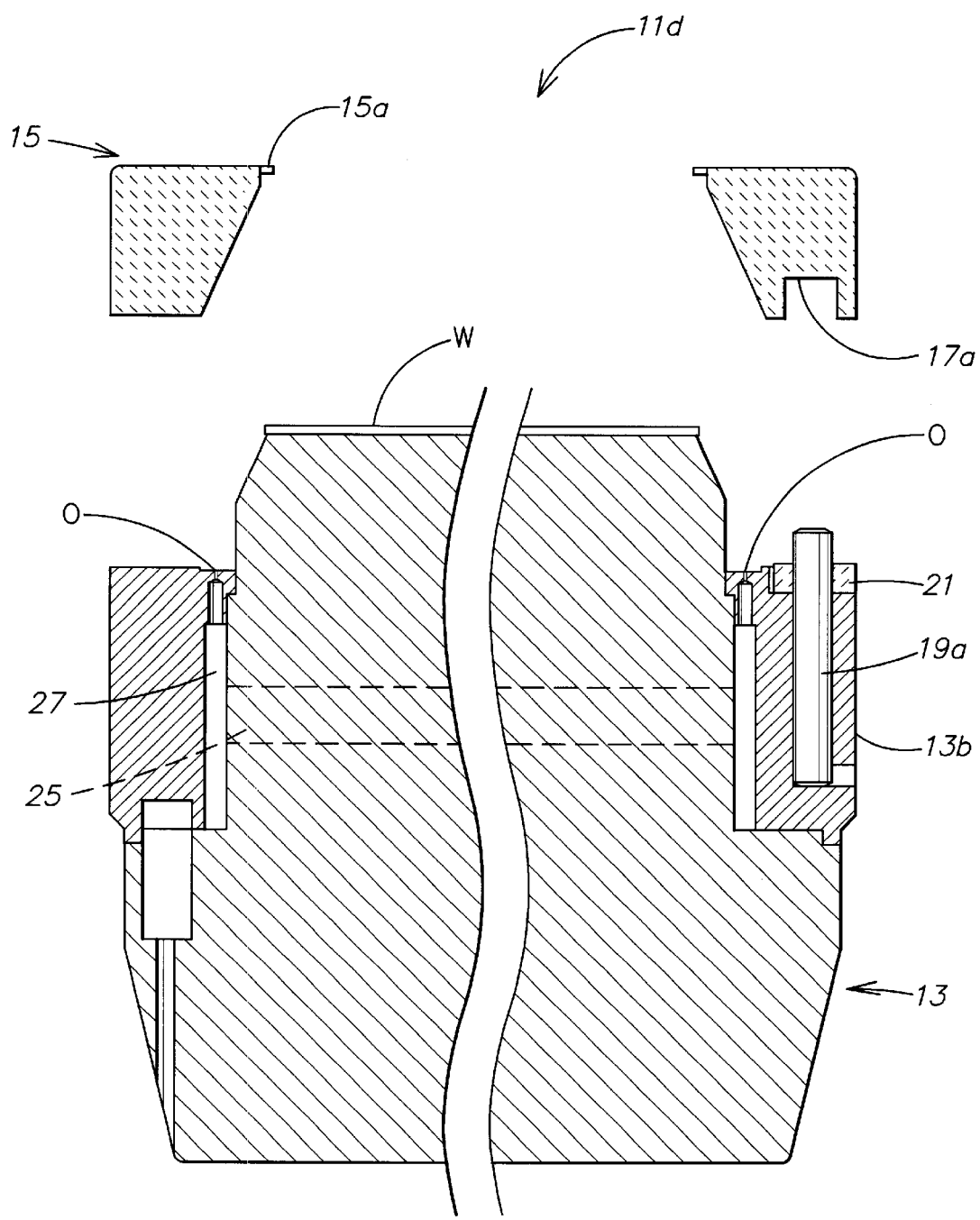

FIGS. 5A and 5B are side views, in pertinent part, of a fourth aspect of the inventive susceptor 11d. The purge ring 15 of FIGS. 5A and 5B is configured such that its inner edge 15a overhangs the edge of the wafer W. Thus the purge ring 15 functions as both a purge ring and a shadow ring (overhanging or shadowing the wafer's edge), as is known in the art. The pin and slot coupling of FIGS. 5A and 5B allows the substrate support 13 to expand and contract without affecting the shape or position of the purge/shadow ring 15, as described above with reference to FIGS. 2 and 3. FIG. 5A shows the purge/shadow ring 15 in a process position, and FIG. 5B shows the purge/shadow ring 15 in a wafer transfer position. Because shadow rings overlap the wafer's edge, they are conventionally supported in a wafer transfer position above the substrate support 13 (e.g., by a hanger or lip which protrudes from the chamber wall) while a wafer W is placed on or extracted from the substrate support 13. After a wafer is placed on the substrate support 13 the substrate support 13 elevates, transferring the shadow ring from the lip to the substrate support 13 as further described below.

Conventional substrate supports whether to be used with a purge and/or shadow ring are initially lowered to a wafer transfer position. A wafer handler then carries a wafer into position above the substrate support 13; the substrate support 13 elevates and the lift pins thereof (not shown) lift the wafer off the wafer handler. Thereafter the wafer handler retracts and, if a shadow ring is employed, the substrate support 13 further elevates to lift the shadow ring, supported above the substrate support 13 (FIG. 5B) by the walls of the processing chamber (not shown), off of its support.

Figure 6:
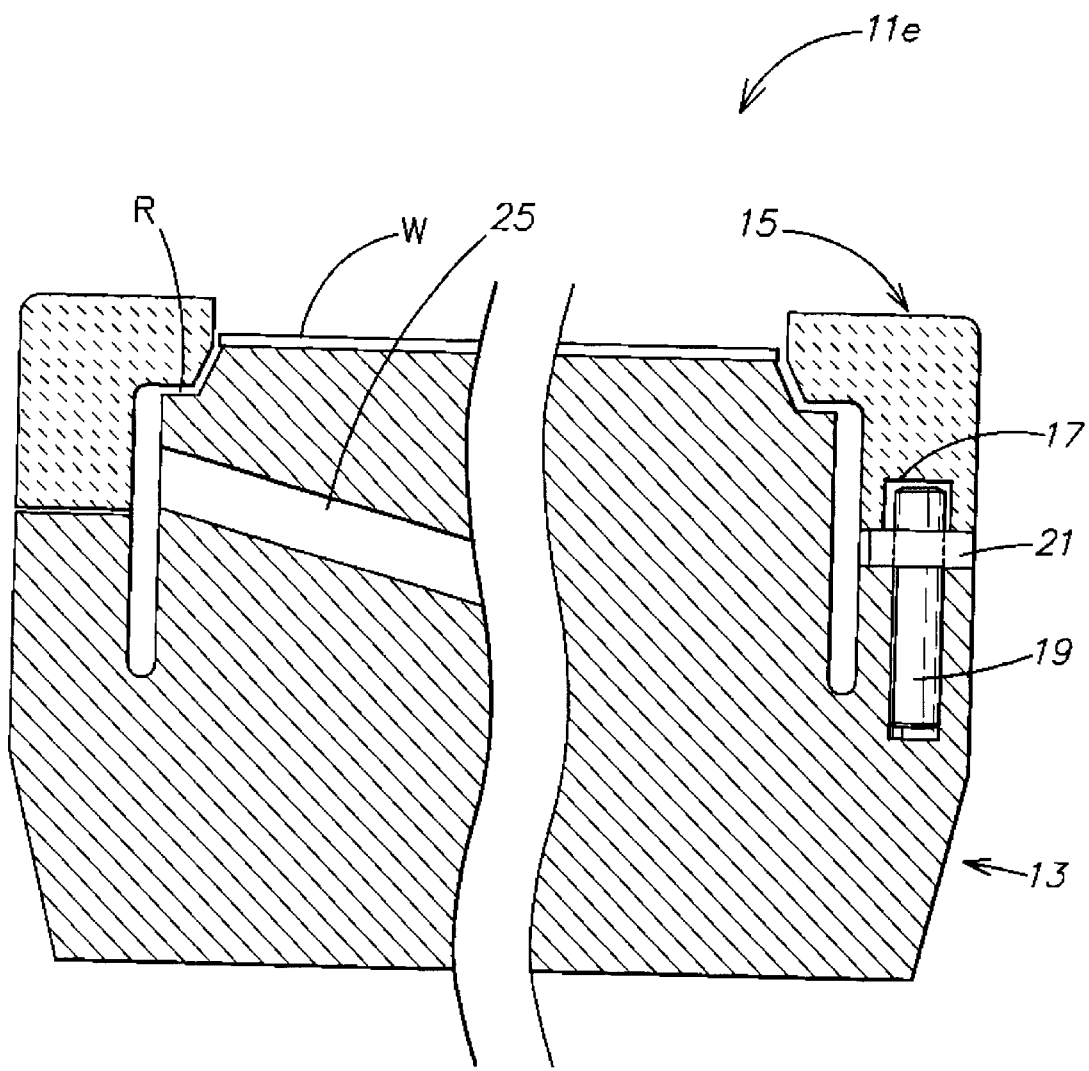
FIG. 6 is a side view in pertinent part of a fifth aspect of the inventive susceptor.

FIG. 6 is a side view in pertinent part of a fifth aspect of the inventive susceptor. The inventive susceptor 11e is configured to facilitate access to the purge gas distribution channel 25 for cleaning. Specifically, the surface of the substrate support 13 in which the pin 19 (or in an alternative embodiment, the slot 17) is located, is below the outlet of the purge gas distribution channel 25. Thus, when the purge and/or shadow ring 15 is removed from the substrate support 13, the gas distribution channel's outlet is exposed. To further facilitate cleaning, the purge gas distribution channel 25 may be angled upwardly (preferably between 0° and 30°), as shown in FIG. 6.

As is apparent from the above description, a chamber such as the chamber described in commonly assigned U.S. patent application Ser. No. 09/103,462 filed Jun. 24, 1998 (incorporated herein in its entirety), when employing the inventive susceptor of FIGS. 1 through 5, provides superior edge deposition prevention and increased throughput as compared to conventional deposition chambers (CVD, PVD, etc.).

The foregoing description discloses only the preferred embodiments of the invention, modifications of the above disclosed apparatus and method which fall within the scope of the invention will be readily apparent to those of ordinary skill in the art. For instance, the inventive susceptor comprises pin and slot coupling between any type of edge ring (purge and/or shadow), whether the pins are located on the substrate support or the ring. Although each of the figures shows the use of thermally insulating pads these pads are optional. Further, it will be understood that a heating element may be included in the susceptor, as is conventionally known. Also as conventionally known, each of the gas delivery channels 25 of the various embodiments of the invention preferably open into a purge gas distribution channel 27 which also extends somewhat below the opening of the gas delivery channel 25 (as shown in each of the figures), so as to create a buffer channel which ensures more even distribution of the purge gas to the purge slots 29.

The terms pin and slot are to be broadly interpreted to include shapes other than the straight pins and slots shown (e.g., rectangular keys, etc.). Further, purge or purge/shadow rings can be advantageously removably coupled to a substrate support, by mechanisms other than pin and slot coupling. Any removably coupled purge ring will benefit from the exposed outlet of the purge gas delivery channel and the upwardly angled purge gas delivery channel. Similarly a susceptor whether or not having a removably coupled purge ring, can benefit from the definition of a purge gas distribution channel having a restrictor gap between the substrate support and the purge ring. Thus, these aspects of the invention should not be respectively limited to pin and slot coupling or to removably coupled purge rings.

Accordingly, while the present invention has been disclosed in connection with the preferred embodiments thereof, it should be understood that other embodiments may fall within the spirit and scope of the invention, as defined by the following claims.

The invention claimed is:

1. An apparatus comprising:
   a substrate support configured to support a substrate and comprising a first material having a first coefficient of thermal expansion, the substrate support having a plurality of pins extending therefrom;
   an edge ring comprising a second material having a second coefficient of thermal expansion which differs from the first coefficient of thermal expansion, the edge ring having a plurality of hollow regions formed therein, each of the hollow regions being at least as wide as a corresponding one of the plurality of pins and extending in a direction in which the substrate support expands and contracts during thermal cycling; and
   a plurality of pads each comprising a thermally insulating material and each surrounding a different one of the plurality of pins so as to separate the substrate support and the edge ring;
   wherein the plurality of pins are inserted within the plurality of hollow regions, and wherein each of the plurality of hollow regions:
      extends a length which is sufficient to compensate for a differential expansion of the substrate support and the edge ring caused by the difference between the first coefficient of thermal expansion and the second coefficient of thermal expansion over the range of process temperatures to which the apparatus is exposed; and has a depth greater than a length of the corresponding one of the plurality of pins, such that with use of the thermally insulating pads, the edge ring is thermally insulated from the substrate support.

2. The apparatus of claim 1, wherein the substrate support further comprises a diffuser ring from which the plurality of pins extend, and the edge ring comprises a purge ring.

3. The apparatus of claim 1, wherein the first material comprises a metal, and the second material comprises a ceramic.

4. The apparatus of claim 1, wherein the substrate support has a substrate supporting surface, and wherein the plurality of pins are equally spaced around the substrate supporting surface, and each of the plurality of hollow regions extends radially outward relative to the substrate supporting surface.

5. The apparatus of claim 1 wherein the substrate support comprises a purge gas channel, and the edge ring comprises a purge ring.

6. The apparatus of claim 1 wherein the edge ring comprises a shadow ring.

7. An apparatus comprising:

an edge ring comprising a first material having a first coefficient of thermal expansion, the edge ring having a plurality of pins extending therefrom;

a substrate support comprising:

a second material having a second coefficient of thermal expansion which differs from the first coefficient of thermal expansion;

a purge gas delivery channel; and a plurality of hollow regions, each of the hollow regions being at least as wide as a corresponding one of the plurality of pins and extending in a direction in which the substrate support expands and contracts during thermal cycling; and a purge gas distribution channel defined between the substrate support and the edge ring, and configured to receive gas from the purge gas delivery channel and to deliver the gas to at least an edge of a substrate supported by the substrate support;

wherein the plurality of pins are inserted within the plurality of hollow regions;

wherein each of the plurality of hollow regions extends a length which is sufficient to compensate for a difference between the first coefficient of thermal expansion and the second coefficient of thermal expansion over the range of process temperatures to which the apparatus is exposed; and wherein the plurality of pins are positioned adjacent the purge gas distribution channel such that the pins do not block gas flowing through the purge gas distribution channel.

8. The apparatus of claim 7, further comprising: a pad comprising a thermally insulating material which surrounds each of the plurality of pins and which separates the substrate support and the edge ring; and wherein each of the hollow regions has a depth greater than the length of a corresponding one of the plurality of pins, such that with use of the thermally insulating pads, the edge ring is thermally insulated from the substrate support.

9. The apparatus of claim 7, wherein the substrate support further comprises a diffuser ring in which the plurality of hollow regions are formed, and the edge ring comprises a purge ring.

10. The apparatus of claim 7, wherein the first material comprises a ceramic, and the second material comprises a metal.

11. The apparatus of claim 7, wherein the substrate support has a substrate supporting surface, and wherein the plurality of pins are equally spaced around the substrate supporting surface, and each of the plurality of hollow regions extend radially outward relative to the substrate supporting surface.

12. The apparatus of claim 7, wherein the edge ring comprises a purge ring.

13. The apparatus of claim 7, wherein the edge ring comprises a shadow ring.

14. An apparatus comprising:

a substrate support having a purge gas delivery channel;

a purge ring coupled to the substrate support; and a purge gas distribution channel defined between the substrate support and the purge ring having a restrictor gap adapted to restrict a volume of purge gas flowing from the purge gas delivery channel through the purge gas distribution channel to an edge of a substrate supported by the substrate support.

15. The apparatus of claim 14 wherein the substrate support has a horizontal notch and the purge ring has a corresponding horizontal protrusion which define the restrictor gap.

16. The apparatus of claim 15 wherein the purge ring and the substrate support are coupled via at least a pin and a slot.

17. The apparatus of claim 16 further comprising a thermally insulating pad which surrounds the pin.

18. The apparatus of claim 15 wherein the purge ring and the substrate support are removably coupled.

19. The apparatus of claim 14 wherein the restrictor gap extends around the substrate support in a continuum.

20. An apparatus comprising:

a purge ring; and a substrate support having:

a purge gas delivery channel including an outlet, the purge gas delivery channel angled upwardly in a direction of the outlet; and a surface configured for removable coupling to the purge ring;

wherein the purge ring and the substrate support form a purge gas distribution channel when coupled, the purge gas distribution channel configured to:

receive a gas from the purge gas delivery channel; and deliver the gas to an edge of a substrate supported by the substrate support.

21. The apparatus of claim 20 wherein the surface configured for removable coupling is below the outlet of the purge gas delivery channel.

22. The apparatus of claim 21 wherein the surface configured for removable coupling is configured for pin and slot coupling.

23. An apparatus comprising:

an edge ring comprising a first material having a first coefficient of thermal expansion, the edge ring having a plurality of pins extending therefrom;

a substrate support configured to support a substrate and comprising a second material having a second coefficient of thermal expansion which differs from the first coefficient of thermal expansion, the substrate support having a plurality of hollow regions formed therein, each of the hollow regions being at least as wide as a corresponding one of the plurality of pins and extending in a direction in which the substrate support expands and contracts during thermal cycling; and a plurality of pads each comprising a thermally insulating material and each surrounding a different one of the plurality of pins so as to separate the substrate support and the edge ring;

wherein the plurality of pins are inserted within the plurality of hollow regions, and wherein each of the plurality of hollow regions:

extends a length which is sufficient to compensate for a differential expansion of the substrate support and the edge ring caused by the difference between the first coefficient of thermal expansion and the second coefficient of thermal expansion over the range of process temperatures to which the apparatus is exposed; and has a depth greater than a length of the corresponding one of the plurality of pins, such that with use of the thermally insulating pads, the edge ring is thermally insulated from the substrate support.

24. An apparatus comprising:

a substrate support comprising:
  a first material having a first coefficient of thermal expansion;
  a purge gas delivery channel; and
  a plurality of pins extending therefrom;

an edge ring comprising a second material having a second coefficient of thermal expansion which differs from the first coefficient of thermal expansion, the edge ring having a plurality of hollow regions formed therein, each of the hollow regions being at least as wide as a corresponding one of the plurality of pins and extending in a direction in which the substrate support expands and-contracts during thermal cycling; and a purge gas distribution channel defined between the substrate support and the edge ring, and configured to receive gas from the purge gas delivery channel and to deliver the gas to at least an edge of a substrate supported by the substrate support;

wherein the plurality of pins are inserted within the plurality of hollow regions;

wherein each of the plurality of hollow regions extends a length which is sufficient to compensate for a difference between the first coefficient of thermal expansion and the second coefficient of thermal expansion over the range of process temperatures to which the apparatus is exposed; and wherein the plurality of pins are positioned adjacent the purge gas distribution channel such that the pins do not block gas flowing through the purge gas distribution channel.

* * * * *